United States Patent
Aoki (10) Patent No.: US 9,245,609 B2
(45) Date of Patent: Jan. 26, 2016

(54) SEMICONDUCTOR STORAGE DEVICE

(71) Applicant: FUJITSU LIMITED, Kawasaki-shi, Kanagawa (JP)

(72) Inventor: Masaki Aoki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 89 days.

(21) Appl. No.: 14/263,139

(22) Filed: Apr. 28, 2014

(65) Prior Publication Data

US 2014/0347919 A1    Nov. 27, 2014

(30) Foreign Application Priority Data

May 21, 2013    (JP) .................................. 2013-106996

(51) Int. Cl.
*G11C 11/16*    (2006.01)

(52) U.S. Cl.
CPC ........ *G11C 11/1653* (2013.01); *G11C 11/1673* (2013.01); *G11C 11/1675* (2013.01)

(58) Field of Classification Search
CPC ........... G11C 11/1653; G11C 11/1673; G11C 11/1675
See application file for complete search history.

(56) References Cited

U.S. PATENT DOCUMENTS 7,916,556 B2 *    3/2011    Kitagawa ............... G11C 11/16
                                                     365/189.07
2010/0277972 A1    11/2010   Ueda

FOREIGN PATENT DOCUMENTS

JP    2010-262695 A1    11/2010

OTHER PUBLICATIONS

M. Hosomi, et al.; "A Novel Nonvolatile Memory with Spin Torque Transfer Magnetization Switching: Spin-RAM;" IEDM Tech. Dig.; 2005; pp. 473-476 (4 Sheets)/Page 2 of specification.

* cited by examiner

*Primary Examiner* — Harry W Byrne
*Assistant Examiner* — Lance Reidlinger
(74) *Attorney, Agent, or Firm* — Kratz, Quintos & Hanson, LLP (57) ABSTRACT

A semiconductor storage device includes: a memory cell array in which a plurality of pairs of bit lines and source lines, a plurality of word lines, and a plurality of resistance change memory cells are arranged; a write driver, a sense amplifier, a global bit line and a global source line provided on a first end side; a plurality of bit line switches provided between the plurality of bit lines and the global bit line; a plurality of source line switches provided between the plurality of source lines and the global source line; a column decoder; a row decoder; a plurality of bit line ground switches provided between the plurality of bit lines and a ground line on a second end side; and a plurality of source line ground switches provided between the plurality of source lines and a ground line on the second end side.

12 Claims, 13 Drawing Sheets

Circuit Simulation Of Read Current
($V_{BL}-I_{read}$ Characteristic)

Conditions :
$V_{WL}$=1.2V
$V_{SL}$=0V
Cell Tr : 1.2V@65nm
         W/L=0.3/0.06(um)
$R_{MTJ}$=3.6KΩ

|  | FIG. 1 | | Embodiment | |
| --- | --- | --- | --- | --- |
|  | Case A | Case B | Case C | Case D |
| $I_{read}$ (uA) @$V_{BL}$ : 0.2V | 36.7 | 32.4 | 34.3 | 34.4 |
| $\Delta I_{read}$ | 4.3 | | 0.1 | |

SEMICONDUCTOR STORAGE DEVICE

CROSS-REFERENCE TO RELATED APPLICATION

This application is based upon and claims the benefit of priority of the prior Japanese Patent Application No. 2013-106996, filed on May 21, 2013, the entire contents of which are incorporated herein by reference.

FIELD

The technique disclosed herein relates to a semiconductor storage device.

BACKGROUND

Recently, in the field of electronic devices, a mixed semiconductor device including a CMOS logic circuit of silicon (Si) and a large-capacity nonvolatile memory has become important.

A magnetoresistive random access memory (MRAM) performs nonvolatile storage of information in addition to high-speed rewriting of information with no limitation. Because of this, the MRAM has attracted attention as a new nonvolatile memory which replaces not only the memory for the use as a ROM, such as a flash memory, but also the memory for the use as a RAM, such as an SRAM and a DRAM.

Up to now, the orientation of the magnetization free layer is reversed using a magnetic field induced by causing a current to flow through a wire. However, in recent years, it has been found out that the magnetization of the magnetization free layer can be reversed by a spin-transfer torque (STT) (torque of a spin-polarized electron) (spin injection magnetization reversal). Due to this, the current used for rewriting can be reduced, and therefore, the possibility of the practical use of the MRAM is further increased.

Non-Patent Literature 1 describes a fundamental configuration of a spin injection type MRAM).

Further, Patent Literature 1 describes a semiconductor storage device in which read accuracy of data from the cell array has been improved in the MRAM.

RELATED DOCUMENTS

[Patent Document 1] Japanese Laid Open Patent Publication No. 2010-262695
[Non Patent Document 1] "A Novel Nonvolatile Memory with Spin Torque Transfer Magnetization Switching Spin-RAM", M. Hosomi et al., IEDM Tech. Dig., pp. 473-476, 2005

SUMMARY

A semiconductor storage device according to a first aspect of the embodiments, includes a memory cell array in which a plurality of pairs of bit lines and source lines extending in a first direction are arranged in parallel, a plurality of word lines extending in a second direction so as to intersect the plurality of pairs of bit lines and source lines are arranged, and a plurality of resistance change memory cells are arranged in correspondence to the intersections; a write driver provided on a first end side, which is one end in the first direction of the memory cell array; a sense amplifier provided on the first end side; a global bit line and a global source line provided on the first end side; a plurality of bit line switches provided between the plurality of bit lines and the global bit line at the first end; a plurality of source line switches provided between the plurality of source lines and the global source line at the first end; a column decoder that decodes an address signal and which brings either of the plurality of bit line switches and the plurality of source line switches into a connection state in accordance with a read operation, a write operation, and data to be written; a row decoder that decodes an address signal and activates one of the plurality of word lines; a plurality of bit line ground switches provided between the plurality of bit lines and a ground line on a second end side, which is the other end in the first direction of the memory cell array; and a plurality of source line ground switches provided between the plurality of source lines and a ground line on the second end side.

The object and advantages of the embodiments will be realized and attained by means of the elements and combination particularly pointed out in the claims.

It is to be understood that both the foregoing general description and the following detailed description are exemplary and explanatory and are not restrictive of the invention.

DESCRIPTION OF EMBODIMENTS

Before explaining a magnetoresistive random access memory (MRAM) of an embodiment, a configuration of a general MRAM will be explained.

Figure 1:
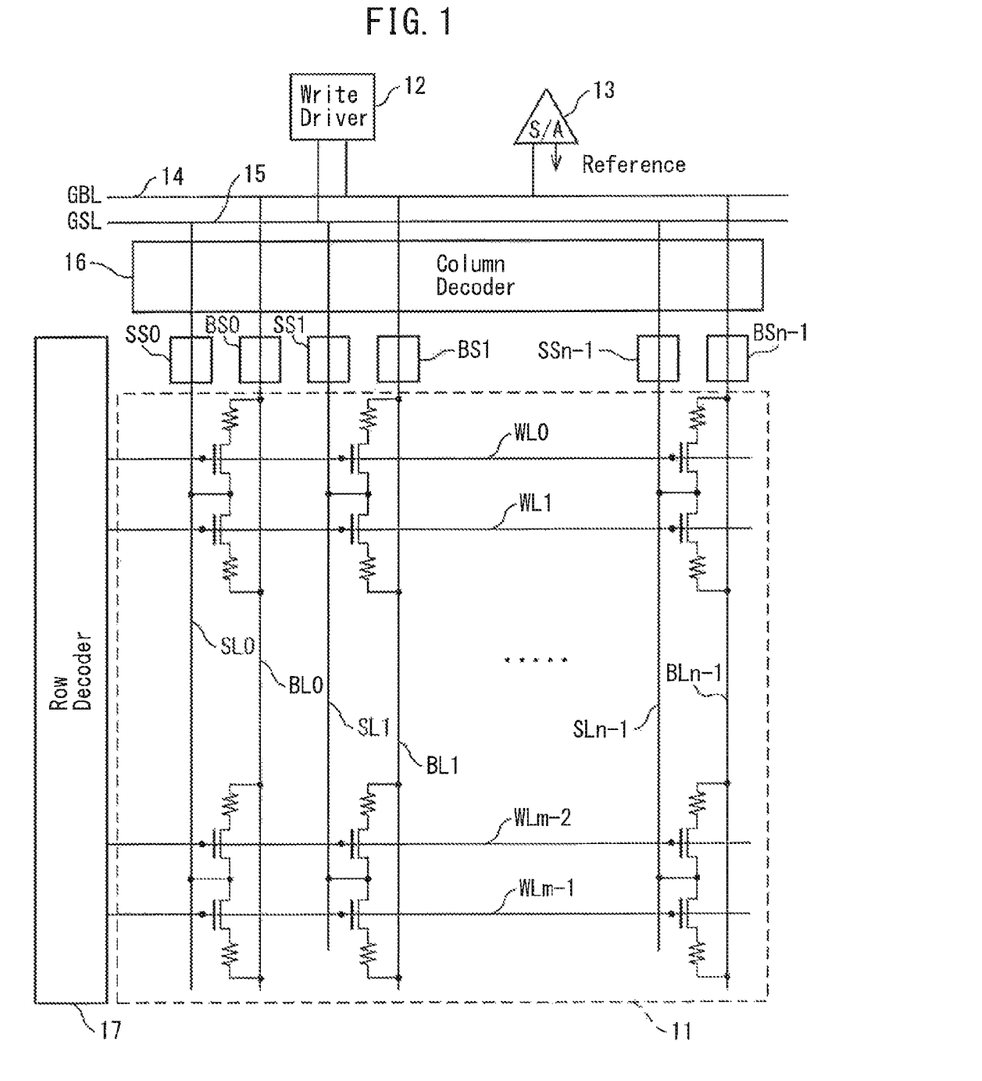
FIG. 1 is a diagram illustrating a configuration of a general MRAM.

FIG. 1 is a diagram illustrating a configuration of a general-type MRAM.

An MRAM has a memory cell array 11, a write driver (WD) 12, a sense amplifier (S/A) 13, a global bit line (BGL) 14, a global, source line (GSL) 15, a plurality of bit line switches BS0 to BSn−1, a plurality of source line switches SS0 to SSn−1, a column decoder 16, and a row decoder 17.

The memory cell array 11 has a plurality of pairs of bit line and source line, i.e. a pair of bit line BL0 and source line SL0, . . . , and a pair of bit line BLn−1 and source line SLn−1, arranged in parallel and extending in a first direction (in FIG. 1, in the vertical direction) and a plurality of word lines WL0 to WLm−1 extending in a second direction (in FIG. 1, in the transverse direction). The memory cell array 11 has a plurality of resistance change memory cells arranged in correspondence to the intersections of the plurality of pairs of bit line and source line and the plurality of word lines. The resistance change memory cell has a spin injection-type (magnetic tunnel junction (MTJ)) element and a transistor connected in series between the corresponding bit line and the corresponding source line and the gate of the transistor is connected to the corresponding word line.

The WD 12, the S/A 13, the GBL 14, and the GSL 15 are provided on a first end side, which is one end (in FIG. 1, the end on the upper side) in the first direction of the memory cell array 11.

The plurality of bit line switches BS0 to BSn−1 is provided between the plurality of bit lines BL0 to BLn−1 and the GBL 14 at the first end and when the bit line switch becomes active (turns on), the corresponding bit line is connected to the GBL 14.

The plurality of source line switches SS 0 to SS n−1 is provided between the plurality of source line switches SL 0 to SL m−1 and the GSL 15 at the first end and when the source line switch becomes activate (turns on), the corresponding source line is connected to the GSL 15.

The column decoder 16 decodes an address signal and brings the pair of bit line switch and source line switch to which the memory cell of the column to be accessed is connected into the connection (on) state.

The row decoder 17 decodes an address signal and activates the word line to which the memory cell (gate of the transistor) of the row to be accessed is connected.

Figure 2A:
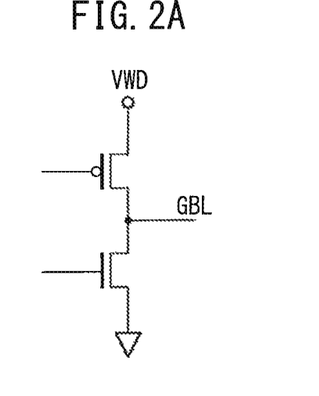
FIG. 2A is a circuit diagram illustrating a forward driver of the write driver (WD)
Figure 2B:
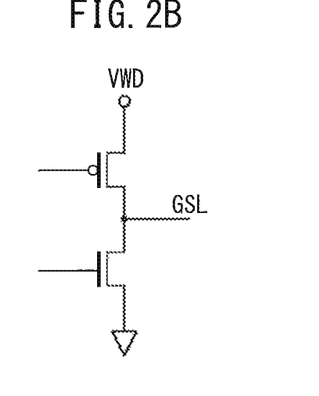
FIG. 2B is a circuit diagram illustrating a reverse driver of the write driver (WD)

FIG. 2A is a circuit diagram illustrating a forward driver of the write driver (WD) 12, and FIG. 2B is a circuit diagram illustrating a reverse driver of the write driver (WD) 12.

The WD 12 has both the forward (FW) driver in FIG. 2A and the reverse (RS) driver in FIG. 2B. The output of the FW driver in FIG. 2A is connected to the GBL 14 and the output of the RV driver in FIG. 2B is connected to the GSL 15.

The memory element has different resistance values depending on the direction in which a current having a predetermined value or more (write current) is caused to flow and stores data in association with the difference in resistance value.

Figure 3A:
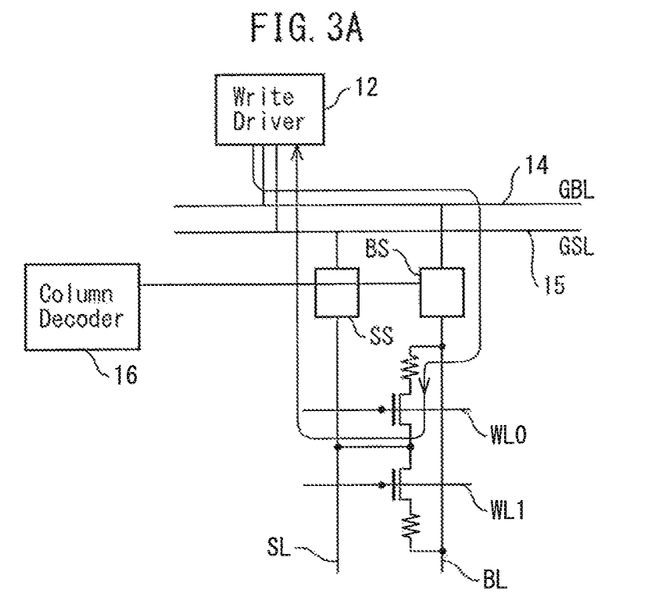
FIG. 3A is a diagram illustrating the case where the write current is caused to flow in the forward direction to write "0" in the write operation.
Figure 3B:
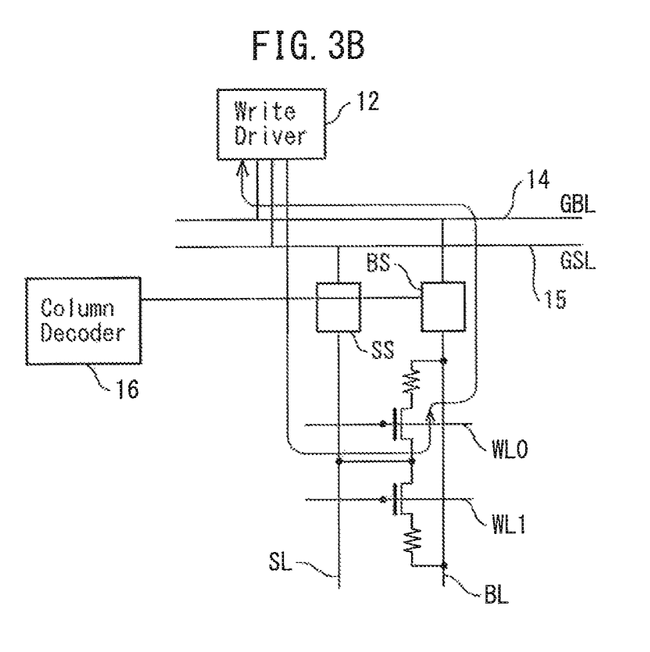
FIG. 3B is a diagram illustrating the case where the write current is caused to flow in the reverse direction to write "1" in the write operation.

FIG. 3A is a diagram illustrating the case where the write current is caused to flow in the forward direction to write "0" in the write operation, and FIG. 3B is a diagram illustrating the case where the write current is caused to flow in the reverse direction to write "1" in the write operation.

As illustrated in FIG. 3A, the pair of bit line switch BS and source line switch SS to which the memory cell of the column to be accessed is connected is turned on by the column decoder 16. Further, by the row decoder 17, the word line (here, the WL0) to which the memory cell of the row to be accessed is connected is activated and the transistor of the memory cell is turned on. When writing "0", to the gates of a P-channel transistor (PchTr) and an N-channel transistor (NchTr) of the FW driver of the WD 12, "L (Low)" is applied to turn on the PchTr and to turn off the NchTr. Further, to the gates of the PchTr and the NchTr of the RV driver of the WD 12, "H (High)" is applied to turn off the PchTr and to turn on the NchTr. In this state, the write current flows through a path from a power source VWD of the WD12 and the PchTr of the FW driver to the GBL 14, the BS, the transistor of the memory cell, the MTJ element, the SS, the GSL 15, the NchTr of the RV driver of the WD 12, and the GND. When the write current flows in the forward direction in this manner, the resistance of the MTJ element becomes relatively small.

On the other hand, when writing "1", as illustrated in FIG. 3B, to the gates of the PchTr and the NchTr of the FW driver of the WD 12, "H" is applied to turn off the PchTr and to turn on the NchTr. Further, to the gates of the PchTr and the NchTr of the RV driver of the WD 12, "L" is applied to turn on the PchTr and to turn off the NchTr. In this state, the write current flow through a path from the power source VWD of the WD 12 and the PchTr of the RV driver to the GSL 15, the SS, the MTJ element, the transistor of the memory cell, the BS, the GBL 14, the NchTr of the FW driver of the WD 12, and the GND. When the write current flows in the reverse direction in this manner, the resistance of the MTJ element becomes relatively large.

The data written to the resistance change memory cell is read by causing a read current, which is smaller than the write current and which does not affect the written state, to flow and by detecting the difference in the current due to the resistance of the MTJ element. Specifically, a reference cell having an intermediate resistance value between the resistance value corresponding to "1" of the resistance change memory cell and the resistance value corresponding to "0" is provided and the same read voltage is applied to the resistance change memory cell and the reference cell by the S/A 13. Due to the difference in the resistance value corresponding to the data stored in the resistance change memory cell, the current flowing through the resistance change memory cell becomes large or small with respect to the current flowing through the reference cell, and therefore, the difference is converted into a difference in voltage and then amplified and output.

Figure 4:
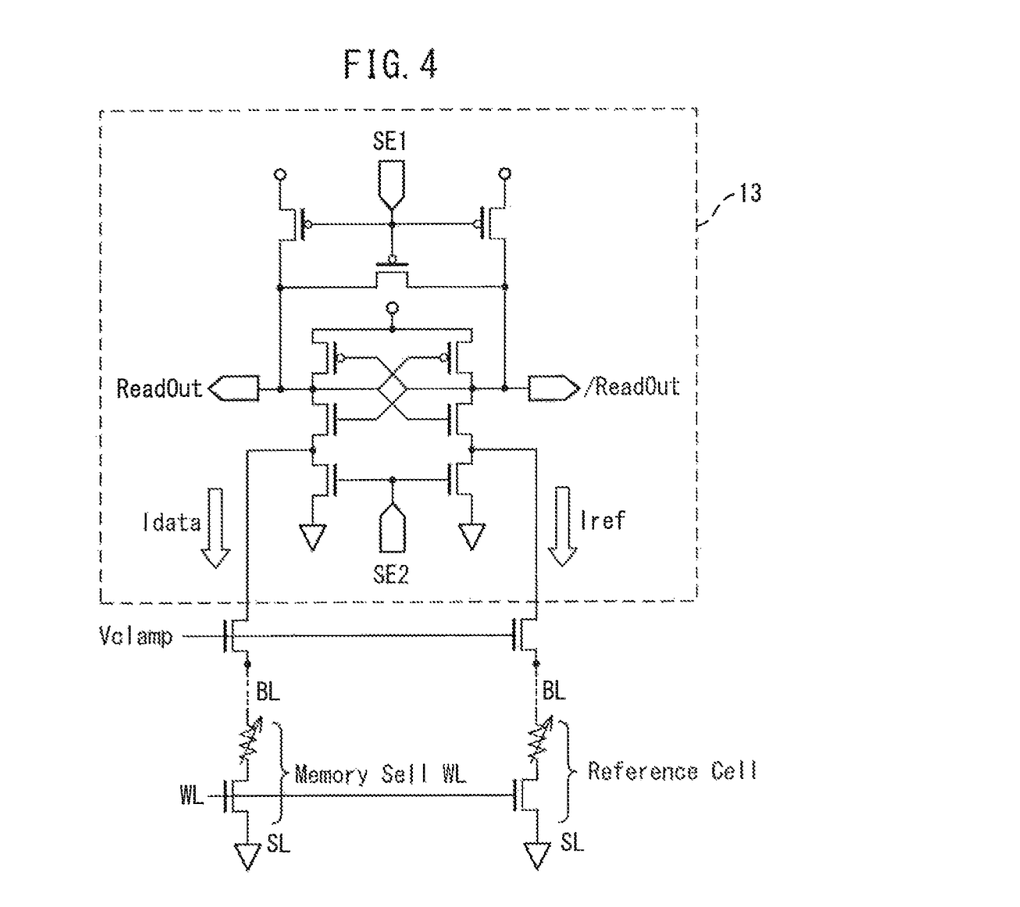
FIG. 4 is a circuit diagram of the sense amplifier (S/A)

FIG. 4 is a circuit diagram of the sense amplifier (S/A) 13.

The sense amplifier 13 is a lath type sense amplifier used commonly in the SRAM, etc. One terminal of the sense amplifier 13 is connected to the GBL 14 via a clamp transistor (switch) and is further connected to the GSL 15 via the selected BS, the resistance change (MTJ) memory element and the transistor of the memory cell, and the selected SS. At the time of read, a Vclamp signal is activated and the GSL 15 is grounded, and therefore, a current path from the sense amplifier 13 to the GND through the selected MTJ element is formed. The current that flows at this time differs depending on the resistance value of the MTJ element.

On the other hand, the other terminal of the sense amplifier 13 is connected to a path including the reference cell in place of the memory cell including the MTJ element, similar to the above-mentioned current pass and a current flows similarly. The reference cell has the same configuration as that of the memory cell and the resistance value is set to an intermediate resistance value between the resistance value corresponding to "1" of the resistance change memory cell, and the resistance value corresponding to '0' by adjusting the area of the MTJ element.

When reading, on the memory cell side, a fixed read voltage is applied to the memory cell, and a memory cell, current Idata reflecting each resistance state is caused to flow. The read voltage applied to the memory cell is controlled by the Vclamp signal voltage. To the memory cell, the voltage, which is the Vclamp signal voltage from which a voltage corresponding to a threshold voltage of the claim transistor is subtracted, is applied as a result. On the other hand, on the reference side also, the same voltage is applied. The memory cell current Idata is set to a current value that is smaller than that of the write current and with which the data written to the memory cell does not change.

The operation of the sense amplifier (S/A) 13 is divided into (1) precharge, (2) amplification, and (3) acceleration.

In the (1) precharge, an SE 1 is in the L state and output nodes Read Out and /Read Out are set to voltages in the vicinity of the power source voltage. The PchTr in the latch circuit within the S/A 13 is in the off state, and therefore, the latch circuit does not operate. A precharge current flows and the bit line BL (including GBL) is precharged.

In the (2) amplification, by turning the SE1 to the output nodes Read Out and /Read Out are discharged at different speeds by the memory cell current Idata and a reference current Iref, respectively, and the voltages decrease gradually. The voltage of one of the output nodes, from which a current (the memory cell current Idata or the reference current Iref) is discharged larger than the other, decreases more rapidly, and the output node of the latch circuit is pulled toward the "L" side, thus operating the latch circuit.

When the voltage difference between the output nodes Read Out and /Read Out becomes sufficiently large, by turning an SE2 to "H", the amplification of the latch is accelerated. As previously described, the reference cell is set to an intermediate resistance value between the resistance value corresponding to "1" of the resistance change memory cell and the resistance value corresponding to "0". Because of this, the values of the output nodes Read Out and /Read Out in the case where the data written to the resistance change memory cell is are opposite to those in the case of "0".

Figure 5:
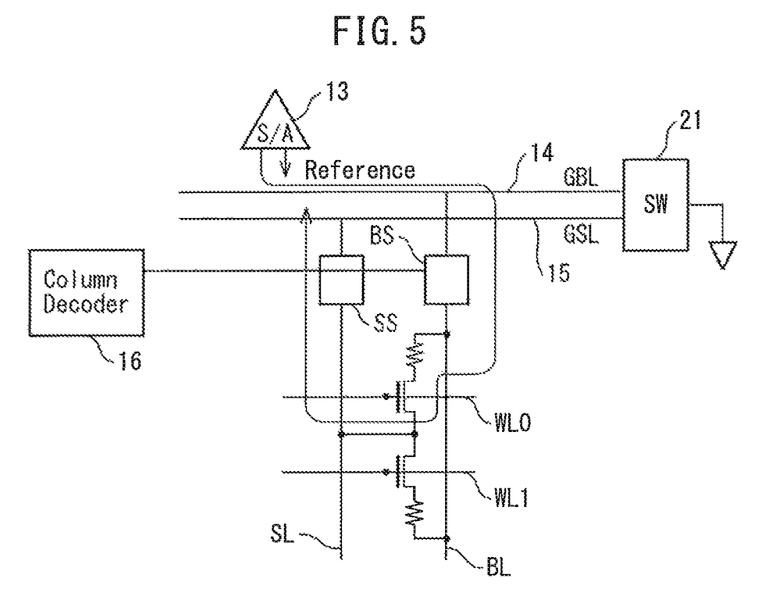
FIG. 5 is a diagram explaining the read operation.

FIG. 5 is a diagram explaining the read operation.

As illustrated in FIG. 5, the global source line (GSL) 15 is grounded via a switch (SW) 21 and at the time of read operation, the SW 21 enters the connection state and connects the GSL 15 to the GND. It is also possible to provide the same function as that of the SW21 to the source line switch SS instead of providing the SW 21.

At the time of read operation, as illustrated in FIG. 5, the pair of bit line switch BS and source line switch SS, to which the memory cell of the column to be accessed, is connected is turned on by the column decoder 16. Further, the word line (here, WL 0), to which the memory cell of the row to be accessed is connected, is activated by the row decoder 17, and the transistor of the memory cell is turned on. Due to this, the read current flows through the path of the GBL 14, the BS, the MTJ element, the transistor of the memory cell, the SS, the GSL 15, the SW 21, and the GND.

As explained above, in the MRAM, a plurality of pairs of bit line switch BS and source line switch SS are provided and in accordance with the selection signal of the column decoder 16, the bit line switch BS and the source line switch SS of the column to be selected are brought into the connection state. The selection signal to select the pair of bit line switch BS and source line switch SS to be brought into the connection state is generated by the column decoder 16. In view of the wiring of the plurality of bit line switches BS and the plurality of source line switches SS from the column decoder 16, the plurality of bit line switches BS and the plurality of source line switches SS are provided on the same side of the memory cell array 11 (in FIG. 1, on the upper side).

A spin injection-type MRAM reads the high resistance ("1") and the low resistance ("0") of the MTJ element, which serves as a memory cell, however, in the case where a memory cell array is configured, the resistance value to which the wire resistance of the array including both the bit line and the source line is added is read as a result. In the case of the conventional spin injection type MRAM, depending on the position of the memory cell, the influence of the wire resistance is different.

Figure 6A:
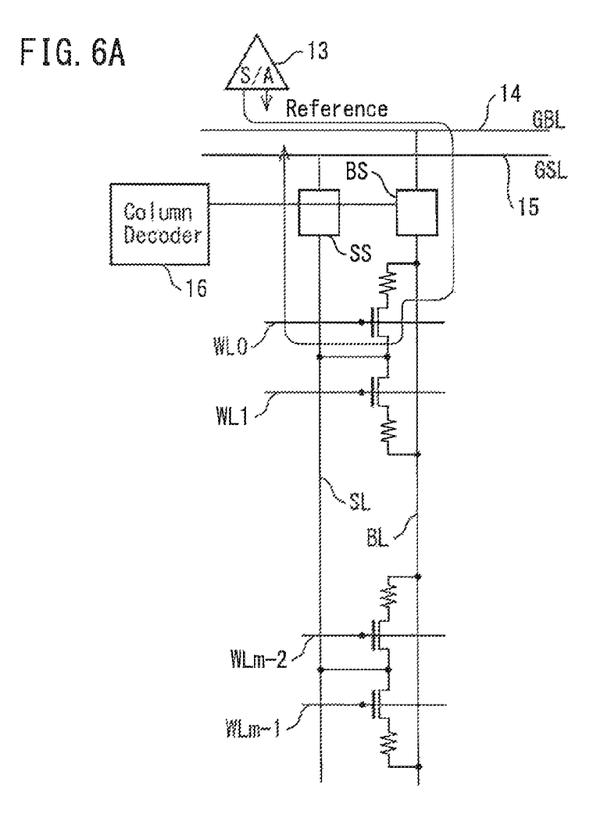
FIG. 6A and FIG. 6B are diagrams explaining the influence of the wire resistance depending on the position in a first direction (in the vertical direction in FIG. 1) of the memory cell to be accessed at the time of read processing.
Figure 6B:
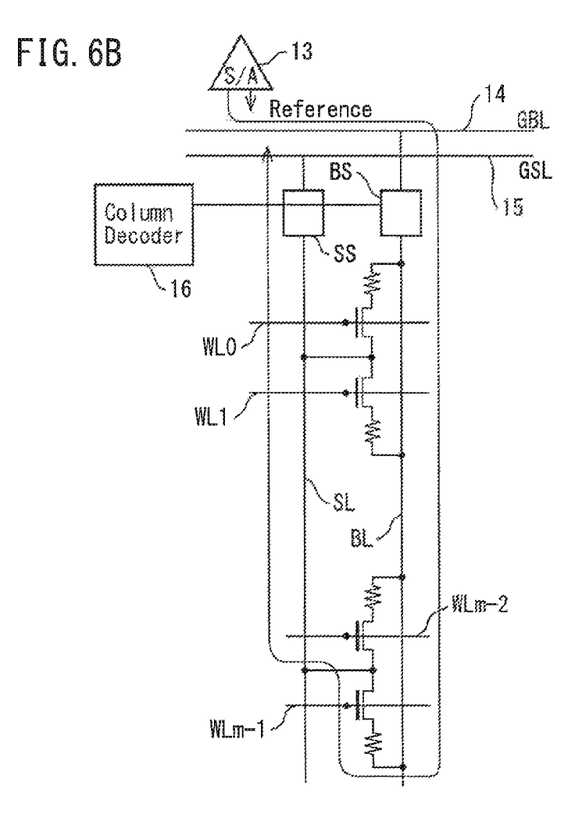

FIG. 6A and FIG. 6B are diagrams each explaining the influence of the wire resistance depending on the position in a first direction (in the vertical direction in FIG. 1) of the memory cell to be accessed at the time of read processing, and FIG. 6A illustrates the case where the memory cell closest to the BS and the SS is accessed and FIG. 6B illustrates the case where the memory cell farthest away is accessed.

In the case where the memory cell closest to the BS and the SS (in FIG. 6A, the first row of the WL 0) is read, the read current flows through the path indicated in FIG. 6A. The lengths of the bit line BL and the source line SL in the path are short.

In the case where the memory cell, far from the BS and the SS (the (m−1)th row of the WLm−1 in FIG. 6B) is read, the read current flows through the path indicated in FIG. 6B. The lengths of the bit line BL and the source line SL in the path are considerably long compared to those of the path in FIG. 6A.

Consequently, in the case where data of the memory cell close to the BS and the SS, i.e., closest to the S/A 13 is read, the wire resistance of the read current path is small and in the case where data of the farthest memory cell is read, the wire resistance of the read current path is large.

Because of this, there is a problem that the variation in the effective resistance of the memory cell at the read operation becomes large and the read margin becomes small.

As described below, an MRAM of an embodiment solves this problem in that a difference in the wire resistance of the read current path depending on the position of the memory cell is small, and a read margin is improved.

Figure 7:
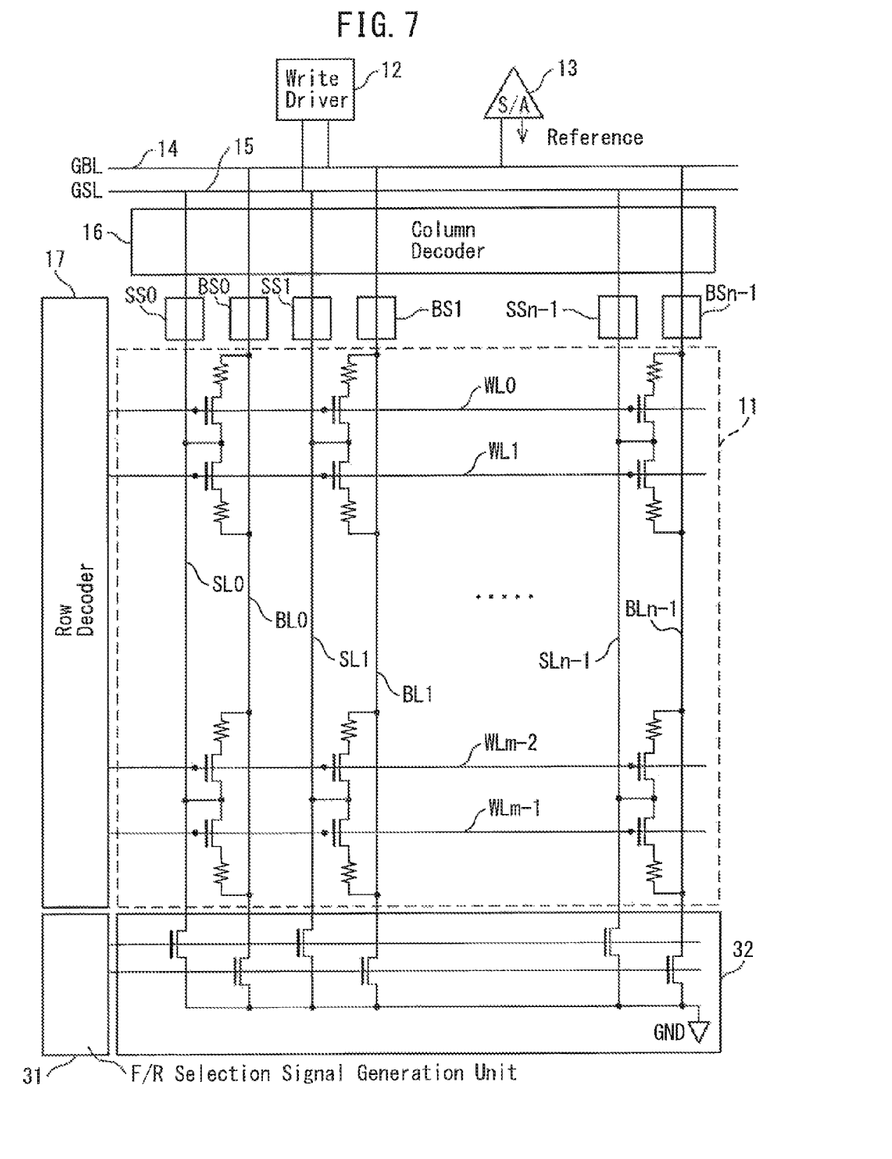
FIG. 7 is a diagram illustrating a configuration of the magnetoresistive memory (MRAM) of an embodiment.

FIG. 7 is a diagram illustrating a configuration of the magnetoresistive memory (MRAM) of an embodiment.

The MRAM of the embodiment has the memory cell array 11, the write driver (WD) 12, the sense amplifier (S/A) 13, the global bit, line (GBL) 14, and the global source line (GSL) 15. The MRAM of the embodiment further has a plurality of bit line switches BS0 to BSn−1, a plurality of source line switches SS0 to SSn−1, the column decoder 16, the row decoder 17, an F/R selection signal generation unit 31, and a ground switch unit 32.

The memory cell array 11 has a plurality of pairs of bit line and source line, i.e. a pair of bit line BL0 and source line SL0, . . . , a pair of bit line BLn−1 and source line SLn−1, arranged in parallel and extending in a first direction (in FIG. 7, in the vertical direction) and a plurality of word lines WL0 to WLm−1 extending in a second direction (in FIG. 7, in the transverse direction). The memory cell array 11 has a plurality of resistance change memory cells arranged in correspondence to the intersections of the plurality of pairs of bit line and source line and the plurality of word lines. The resistance change memory cell has a spin injection type (magnetic tunnel junction (MTJ)) element and a transistor connected in series between the corresponding bit line and the corresponding source line and the gate of the transistor is connected to the corresponding word line.

The MRAM of the embodiment differs from the MRAM in FIG. 1 in that the F/R selection signal generation unit 31 and the ground switch unit 32 are provided and the bit line switch and the source line switch constituting a pair are controlled independently, and others are the same. Hereinafter, different parts are explained.

The ground switch unit 32 is provided on the side of a second end, which is the other end in the first direction of the memory cell array 11 (in FIG. 7, the lower end). In other words, the ground switch unit 32 is provided on the opposite side of the WD 12, the S/A 13, the GBL 14, the GSL 15, and the plurality of bit line switches BS0 to BSn−1 and the plurality of source line switches SS0 to SSn−1 of the memory cell array 11 with respect to the memory cell array 11.

The ground switch unit 32 has a plurality of bit line ground switches provided between the plurality of bit lines BL0 to BLn−1 and the GND terminal and a plurality of source line ground switches provided between the plurality of source lines SL0 to SLn−1 and the GND terminal. The turning on/off of the plurality of bit line ground switches is controlled in common by a reverse signal from the F/R selection signal generation unit 31. In other words, the plurality of bit line ground switches simultaneously enters the connection state when the reverse signal turns on and simultaneously enters the shut-off state when the reverse signal turns off. The turning on/off of the plurality of source line ground switches is controlled in common by a forward signal from the F/R selection signal generation unit 31. In other words, the plurality of source line ground switches simultaneously enters the connection state when the forward signal turns on and simultaneously enters the shut-off state when the forward signal turns off.

The F/R selection signal generation unit 31 turns on the forward signal, and turns off the reverse signal at the time of read operation and forward, write operation to write "1". Further, the F/R selection signal generation unit 31 turns on the reverse signal and turns off the forward signal at the time of reverse write operation to write "0".

The column decoder 16 generates a column selection signal for selecting a column to be accessed by decoding the address signal and brings the bit line switch of the column to be accessed into the on state at the time of read operation and at the time of forward write operation to write "1". At this time, the source line switch of the column to be accessed maintains the off state. Further, the column decoder 16 brings the source line switch of the column to be accessed into the on state a the time of reverse write operation to write "0" and the bit line switch of the column to be accessed maintains the off state.

As described above, the column decoder 16 changes the selection of the switch to be turned on at the time of read operation and at the time of forward write operation to write "1" from that at the time of write operation to write "0". This selection is the same as the selection of the forward signal and the reverse signal output from the F/R selection signal generation unit 31. Consequently, the F/R selection signal generation unit 31 transmits the forward signal and the reverse signal to the column decoder 16. Then, the column decoder 16 takes the logical AND signal of the column selection signal and the forward signal to be the turning on/off signal of the corresponding bit line switch and takes the logical AND signal of the column selection signal and the reverse signal to be the turning on/off signal of the corresponding source line switch. The forward signal and the reverse signal are transferred by two signal lines, and therefore, the F/R selection signal generation unit 31 may be provided in a position other than the second end side and for example, may be provided in the vicinity of the portion to which the read signal, the write signal, the data signal, etc., are input from the outside.

Figure 8:
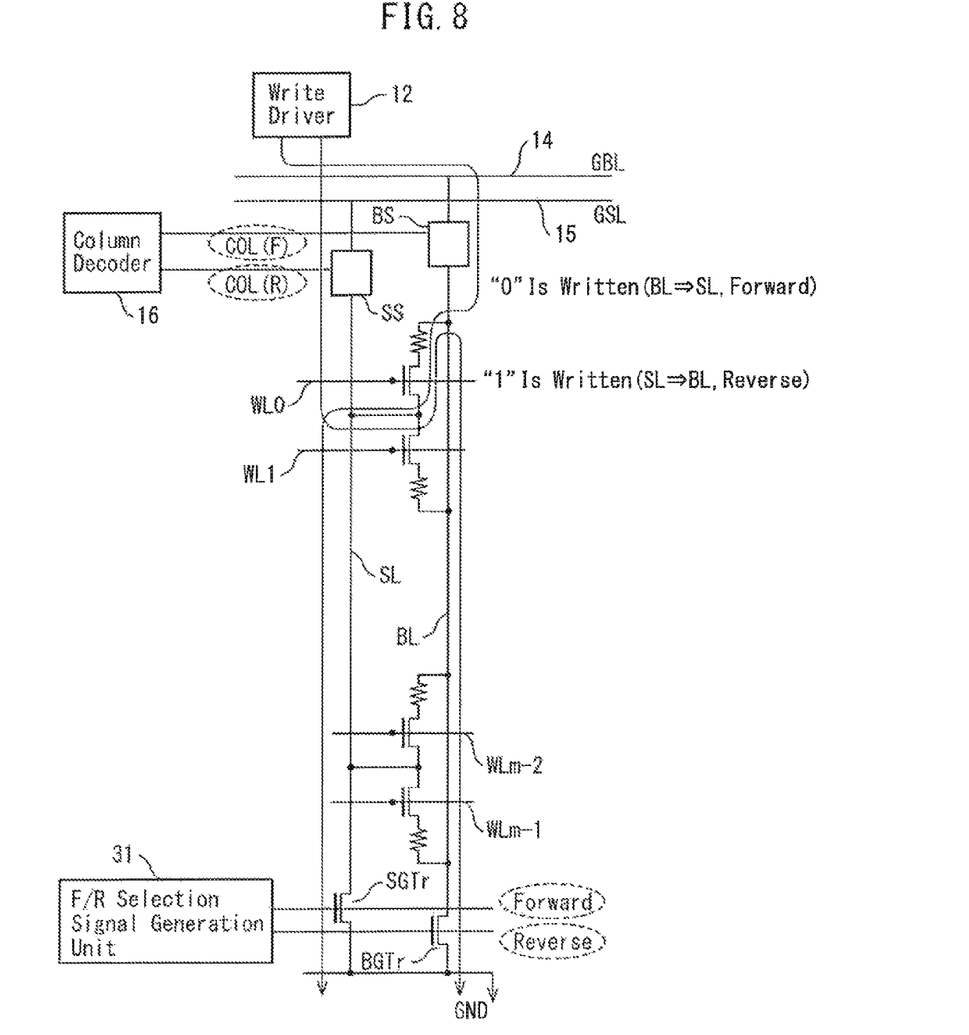
FIG. 8 is a diagram illustrating a path of a write current at the time of write operation.

FIG. 8 is a diagram illustrating a path of a write current at the time of write operation.

At the time of forward write operation to write "1", the BS is turned on, the SS is turned off, a bit line ground switch transistor BGTr of the ground switch unit 32 is turned off, and a source line ground switch transistor SGTr is turned on. Due to this, a write current path from the WD 12 to the GND through the GBL 14, the BS, the BL, the MTJ element, the transistor of the memory cell, the SL, and the SGTr is formed and "1" is written to the memory cell.

At the time of reverse write operation to write "0", the BS is turned on, the SS is turned on, the bit line ground switch transistor BGTr of the around switch unit 32 is turned on, and the source line around switch transistor SGTr is turned off. Due to this, a write current path from the WD 12 to the GND through the GBL 15, the SS, the SL, the transistor of the memory cell, the MTJ element, the BL, and the BGTr is formed and "0" is written to the memory cell.

In the write operation, the influence of the difference in the wire resistance of the current path is small compared to that in the read operation, however, it is desirable for the difference in wire resistance to be small. In the MRAM of the embodiment, as illustrated in FIG. 8, the lengths of the current paths at the time of forward write operation and at the time of reverse write operation are substantially the same despite the difference in position in the first direction (vertical direction) of the memory cell to be written and the difference in wire resistance is small.

Figure 9A:
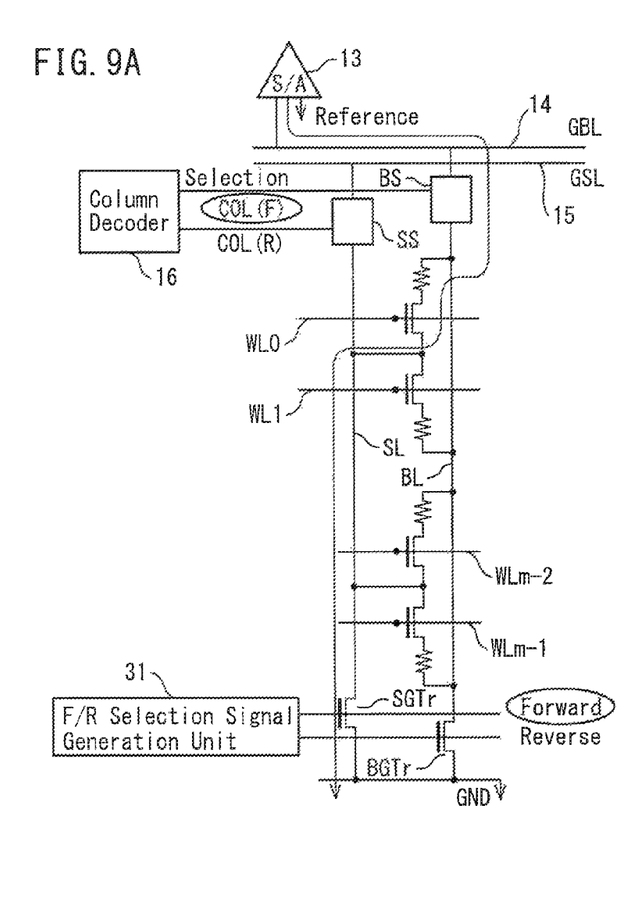
FIG. 9A and FIG. 9B are diagrams illustrating the read current paths at the time of read operation.
Figure 9B:
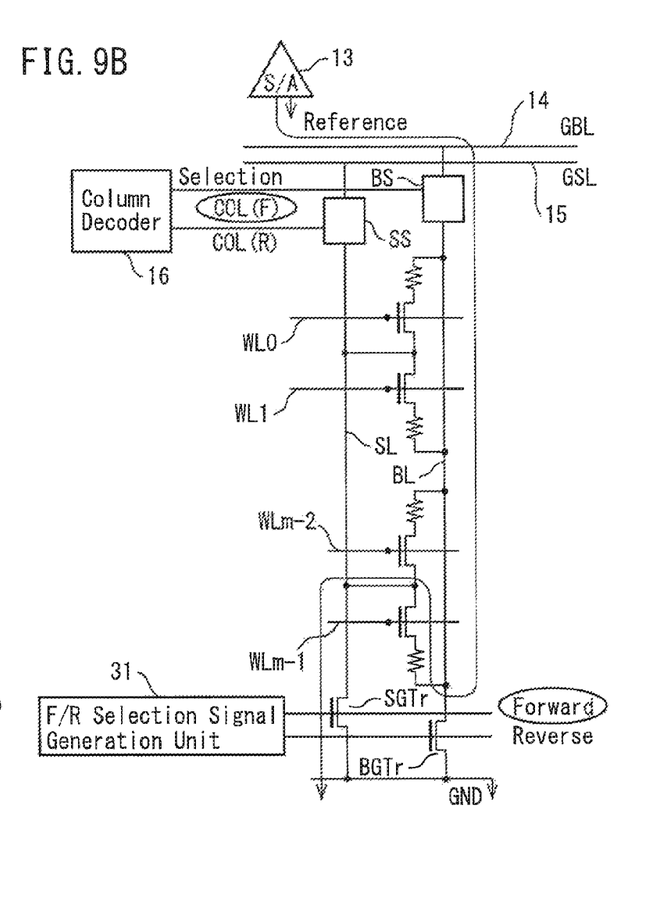

FIG. 9A and FIG. 9B are diagrams illustrating the read current paths at the time of read operation, and FIG. 9A illustrates the case where the memory cell close to the BS and the SS is accessed and FIG. 9B illustrates the case where the far memory cell is accessed.

At the time of read operation, as illustrated in FIG. 9A and FIG. 9B, by the column decoder 16, the bit line switch BS to which the memory cell of the column to be accessed is connected is brought into the on state. At this time, the source line, switch SS maintains the or state. Further, the F/R selection signal generation unit 31 activates the forward signal and brings the bit line ground switch transistor BGTr of the ground switch unit 32 into the on state. At this time, the reverse signal from the F/R selection signal generation unit 31 is inactive and the source line ground switch transistor SGTr maintains the off state. Further, by the row decoder 17, the word line to which the memory cell of the row to be accessed is connected (WL 0 in FIG. 9 and WL m−1 in FIG. 9B) is activated and the transistor of the memory cell is turned on. Due to this, a read current flows through a path of the S/A 13, the GBL 14, the BS, the BL, the MTJ element, the transistor of the memory cell, the SL, the SGTr, and the GND.

As is obvious from the comparison between FIG. 9A and FIG. 9B, the lengths of the paths through which the read current flows are substantially the same between the case where the memory cell close to the BS and the SS is read (first row of the WL0) and the case where the far memory cell ((m−1)th row of the WLm−1) is read. Consequently, the wire resistances of the read current paths are substantially the same regardless of the position in the first direction (vertical direction in FIG. 9A and FIG. 9B) of the memory cell to be accessed. Due this, the variation in the effective resistance of the memory cell at the time of read is suppressed, and therefore, the read margin is increased.

The results of estimation of the influence of the wire resistance in the case where the general configuration in FIG. 1 is applied and in the case where the configuration of the embodiment is applied in the standard MRAM are explained.

(1) BL and SL Wire Resistance

Sheet resistance of BL and SL wire: 0.18Ω/□

Wire width: 0.1 μm

Memory cell length in the first direction (direction in which BL and SL extend): 0.41 μm Number of cells connected to BL: 512

Under the above conditions, BL wire resistance= (0.18Ω/□×0.41×512/0.1=378Ω.

(2) MTJ Element Resistance

Size: 50 nmΦ

RA=7 Ωμm²

From the conditions in FIG. 10, to be described later, MTJ element resistance=3.6 kΩ.

Consequently, the wire resistance of the BL and the SL is about 10% of the MTJ element resistance.

Under the above-mentioned conditions, circuit simulation of the influence on the read current at the time of read was performed.

Figure 10:
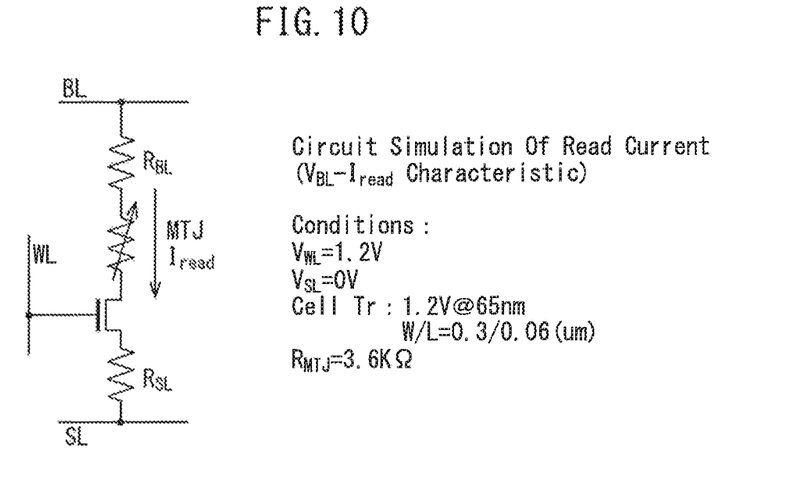
FIG. 10 is a diagram illustrating the conditions of the memory cell under which estimation was made.

FIG. 10 is a diagram illustrating the conditions of the memory cell under which estimation was made.

Figure 11A:
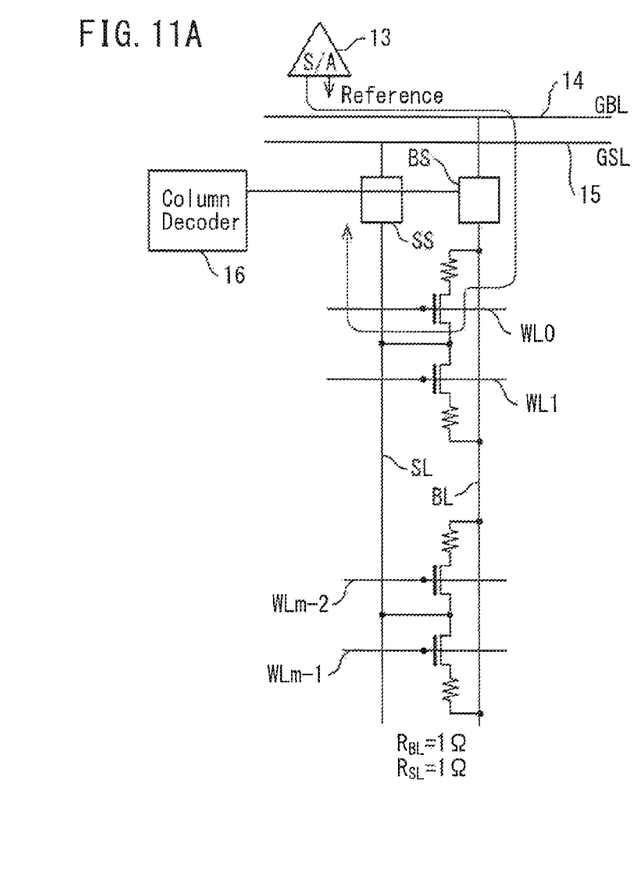
FIG. 11A and FIG. 11B are diagrams illustrating the read current path for which simulation was performed in the MRAM in FIG. 1.
Figure 11B:
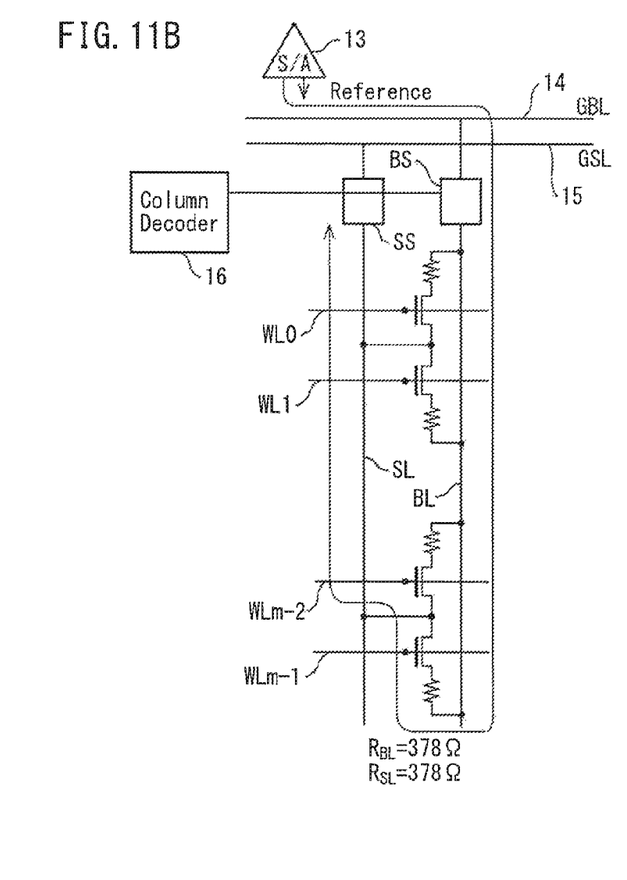

FIG. 11A and FIG. 11B are diagrams each illustrating the read current path for which simulation was performed in the MRAM in FIG. 1, and FIG. 11A illustrates the case where the memory cell close to the BS and the SS is accessed and FIG. 11B illustrates the case where the memory cell far from the BS and the SS is accessed.

Figure 12A:
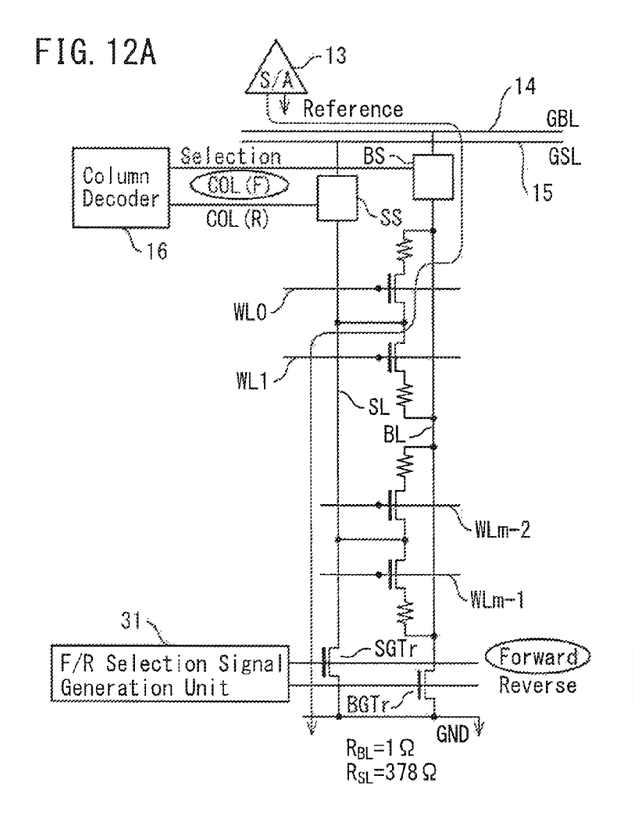
FIG. 12A and FIG. 12B are diagrams illustrating the read current path for which simulation was performed in the MRAM of the embodiment.
Figure 12B:
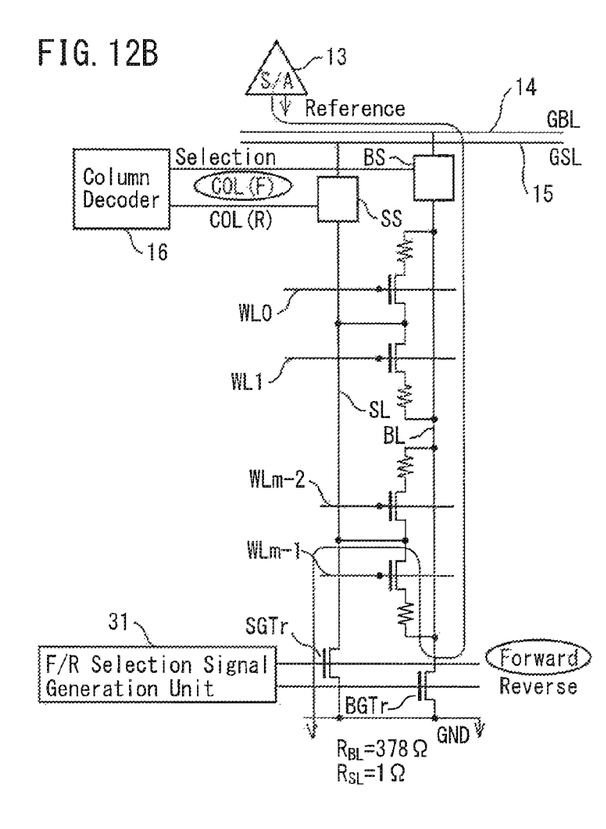

FIG. 12A and FIG. 12B are diagrams each illustrating the read current path for which simulation was performed in the MRAM of the embodiment, and FIG. 12A illustrates the case where the memory cell close to the BS and the SS is accessed and FIG. 12B illustrates the case where the memory cell far from the BS and the SS is accessed.

At the time of read operation, the BL voltage is clamped to about 0.2 V. This is to prevent the tunnel insulating film of the MTJ element from being destroyed when an overvoltage is applied to the memory cell at the time of read.

As illustrated in FIG. 11A, a resistance $R_{BL}$ of the bit line BL in the current path in the case where the memory cell connected to the WL 0 closest to the BS and the SS is accessed in the MRAM in FIG. 1 is 1Ω ($R_{BL}$=1Ω) and a resistance $R_{SL}$ of the source line SL is 1Ω ($R_{SL}$=1Ω). Consequently, the total of the resistances of the bit line BL and the source line SL in the current path is 2Ω.

As illustrated in FIG. 11B, the resistance $R_{BL}$ of the bit line BL in the current path in the case where the memory cell connected to the WL m−1 farthest from the BS and the SS is accessed in the MRAM in FIG. 1 is 378Ω ($R_{BL}$−378Ω) and the resistance $R_{SL}$ of the source line SL=378Ω ($R_{SL}$=378Ω). Consequently, the total of the resistances of the bit line BL and the source line SL in the current path is 756Ω.

As illustrated in FIG. 12A, the resistance $R_{BL}$ of the bit line BL in the current path in the case where the memory cell connected to the WL 0 closest to the BS and the SS is accessed in the MRAM of the embodiment is 1Ω ($R_{BL}$=1Ω) and the resistance $R_{SL}$ of the source line SL is 378Ω ($R_{SL}$=378Ω). Consequently, the total of the resistances of the bit line BL and the source line SL in the current path is 379Ω.

As illustrated in FIG. 12B, the resistance $R_{BL}$ of the bit line BL in the current path in the case where the memory cell connected to the WLm−1 farthest from the BS and the SS is accessed in the MRAM of the embodiment is 378Ω ($R_{BL}$=378Ω) and the resistance $R_{SL}$ of the source line SL is 1Ω ($R_{SL}$=1Ω). Consequently, the total of the resistances of the bit line BL and the source line SL in the current path is 379Ω.

Consequently, in the MARA in FIG. 1, the difference in the total resistance of the bit line BL and the source line in the current path between the case where the memory cell closest to the BS and the SS is accessed and the case where the farthest memory cell is accessed at the time of read operation is 754Ω. In contrast to this, in the MRAM of the embodiment, the difference in the total resistance is substantially zero.

Figure 13A:
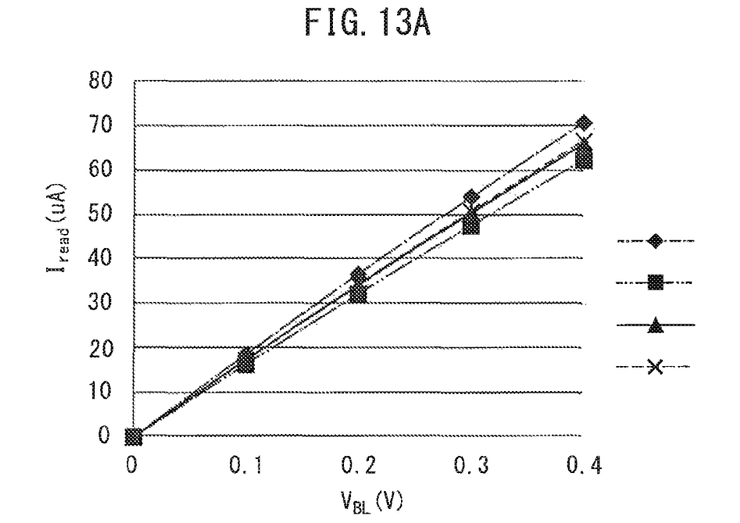
FIG. 13A and FIG. 13B are diagrams illustrating the simulation results of the read current in the cases illustrated in FIG. 11A and FIG. 11B and in FIG. 12A and FIG. 12B.
Figure 13B:
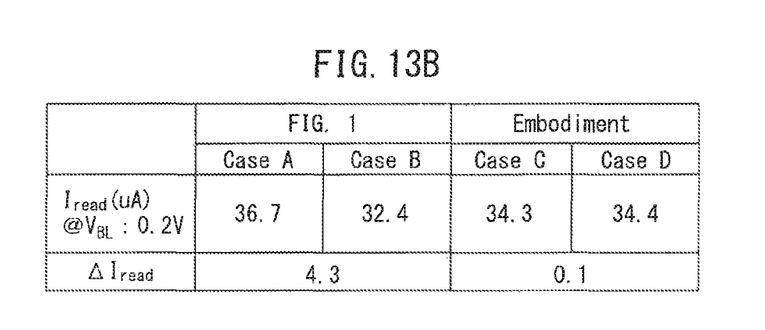

FIG. 13A and FIG. 13B are diagrams illustrating the simulation results of the read current in the cases illustrated in FIG. 11A and FIG. 11B and in FIG. 12A and FIG. 12B. FIG. 13A is a graph illustrating a change in $I_{read}$ (μA) with respect to $V_{BL}$ (V). FIG. 13B illustrates the value of the $I_{read}$ (μA) when the $V_{BL}$ (V) is 0.2 V.

In FIG. 13A, the solid line indicates the case (Case C) where the memory cell closest to the BS and the SS is accessed in the MRAM of the embodiment and the dot line indicates the case (Case D) where the farthest memory cell is accessed. Further, the alternate long and short dash line indicates the case (Case A) where the memory cell closest to the BS and the SS is accessed in the MRAM in FIG. 1 and the two-dot chain line indicates the case (Case B) where the farthest memory cell is accessed.

From FIG. 13 and FIG. 13B, it is known that in the case of Case A, the read current is large and in the case of Case B, the read current is small. In the case of Case C and Case D, the read current is intermediate between the large read current and the small read current and the difference between Case C and Case D is slight.

At the time of read, the cell transistor operates in the linear region. It is possible to simply regard the cell transistor as a resistor and the difference in the path length is the difference in the parasitic wire resistance as it is, and the difference in the read current as it is.

In the MRAM of the embodiment, regardless of the position of the memory cell, the influence of the wire resistance is substantially the same and the values of the read current is substantially the same. Due to this, in the MRAM of the embodiment, the variation in the effective read resistance at the time of read operation is suppressed.

As explained above, in the MRAM of the embodiment, the wire resistance of the path from the memory cell to be accessed to the sense amplifier is the same regardless of the position of the memory cell. Due to this, the variation in the effective resistance of the memory cell when the memory cell is read as a memory is suppressed, and therefore, the read margin is increased.

Consequently, according to the embodiment, only by providing the column decoder on one side of the memory cell array configured to store data by a change in resistance, a semiconductor storage device in which the resistance of the read path is substantially the same regardless of the position of the memory cell, to be read is implemented with a small area.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor storage device comprising:
    a memory cell array in which a plurality of pairs of bit lines and source lines extending in a first direction are arranged in parallel, a plurality of word lines extending in a second direction so as to intersect the plurality of pairs of bit lines and source lines are arranged, and a plurality of resistance change memory cells are arranged in correspondence to the intersections;
    a write driver provided on a first end side, which is one end in the first direction of the memory cell array;

a sense amplifier provided on the first end side;
a global bit line and a global source line provided on the first end side;
a plurality of bit line switches provided between the plurality of bit lines and the global bit line at the first end;
a plurality of source line switches provided between the plurality of source lines and the global source line at the first end;
a column decoder that decodes an address signal and which brings either of the plurality of bit line switches and the plurality of source line switches into a connection state in accordance with a read operation, a write operation, and data to be written;
a row decoder that decodes an address signal and activates one of the plurality of word lines;
a plurality of bit line ground switches provided between the plurality of bit lines and a ground line on a second end side, which is the other end in the first direction of the memory cell array; and
a plurality of source line ground switches provided between the plurality of source lines and a ground line on the second end side.

2. The semiconductor storage device according to claim 1, wherein
the resistance change memory cell includes:
a resistance change element, the resistance value of which changes in accordance with a current direction when a current equal to or larger than a threshold value is caused to flow; and
a transistor connected between the bit line and the source line via the resistance change element and the gate of which is connected to the word line, and
the resistance change memory cell stores a data value in accordance with a difference in resistance value of the resistance change memory cell.

3. The semiconductor storage device according to claim 2, wherein
the resistance change element is a magnetic tunnel junction element, and
the semiconductor storage device is a spin injection type MRAM.

4. The semiconductor storage device according to claim 1, wherein
at the time of write operation, the write driver brings:
one of the plurality of bit line switches selected by the column decoder into a connection state and the plurality of source line ground switches into a connection state when writing one data value; and
one of the plurality of source line switches selected by the column decoder into a connection state and the plurality of bit line ground switches into a connection state when writing the other data value, and
the write driver is brought into an active state in accordance with a data value to be written.

5. The semiconductor storage device according to claim 2, wherein
at the time of write operation, the write driver brings:
one of the plurality of bit line switches selected by the column decoder into a connection state and the plurality of source line ground switches into a connection state when writing one of data values; and
one of the plurality of source line switches selected by the column decoder into a connection state and the plurality of bit line ground switches into a connection state when writing the other data value, and
the write driver is brought into an active state in accordance with a data value to be written.

6. The semiconductor storage device according to claim 3, wherein
at the time of write operation, the write driver brings:
one of the plurality of bit line switches selected by the column decoder into a connection state and the plurality of source line ground switches into a connection state when writing one of data values; and
one of the plurality of source line switches selected by the column decoder into a connection state and the plurality of bit line ground switches into a connection state when writing the other data value, and
the write driver is brought into an active state in accordance with a data value to be written.

7. The semiconductor storage device according to claim 1, wherein
at the time of read operation:
one of the plurality of bit line switches selected by the column decode is brought into a connection state and the plurality of source line ground switches is brought into a connection state; and
the sense amplifier is brought into an active state.

8. The semiconductor storage device according to of claim 2, wherein
at the time of read operation:
one of the plurality of bit line switches selected by the column decode is brought into a connection state and the plurality of source line ground switches is brought into a connection state; and
the sense amplifier is brought into an active state.

9. The semiconductor storage device according to claim 3, wherein
at the time of read operation:
one of the plurality of bit line switches selected by the column decode is brought into a connection state and the plurality of source line ground switches is brought into a connection state; and
the sense amplifier is brought into an active state.

10. The semiconductor storage device according to claim 4, wherein
at the time of read operation:
one of the plurality of bit line switches selected by the column decode is brought into a connection state and the plurality of source line ground switches is brought into a connection state; and
the sense amplifier is brought into an active state.

11. The semiconductor storage device according to claim 5, wherein
at the time of read operation:
one of the plurality of bit line switches selected by the column decode is brought into a connection state and the plurality of source line ground switches is brought into a connection state; and
the sense amplifier is brought into an active state.

12. The semiconductor storage device according to claim 6, wherein
at the time of read operation:
one of the plurality of bit line switches selected by the column decode is brought into a connection state and the plurality of source line ground switches is brought into a connection state; and
the sense amplifier is brought into an active state.

* * * * *